US005161255A

United States Patent [19]

Tsuchiya

[11] Patent Number: 5,161,255

[45] Date of Patent: Nov. 3, 1992

[54] MOTOR VEHICLE-MOUNTED RADIO WAVE RECEIVING GPS APPARATUS REQUIRING NO DRILL HOLES FOR MOUNTING

[75] Inventor: Toshiaki Tsuchiya, Saitama, Japan

[73] Assignee: Pioneer Electronic Corporation, Tokyo, Japan

[21] Appl. No.: 645,527

[22] Filed: Jan. 24, 1991

[30] Foreign Application Priority Data

Jan. 26, 1990 [JP] Japan .................................... 2-14971
Jan. 26, 1990 [JP] Japan .................................... 2-14972

[51] Int. Cl.[5] ........................ H04B 1/16; H05K 11/02

[52] U.S. Cl. .................................... 455/345; 455/281; 455/343

[58] Field of Search ............... 455/269, 280, 281, 189, 455/346, 345, 343, 7, 11, 12, 152.1; 343/700 MS, 711, 712, 713, 715, 717

[56] References Cited

U.S. PATENT DOCUMENTS 4,779,098 10/1988 Blaese ................................. 343/715
4,887,089 12/1989 Shibata et al. .
4,916,456 4/1990 Shyu .................................... 343/713

FOREIGN PATENT DOCUMENTS 0276817 8/1988 European Pat. Off. .
0279117 8/1988 European Pat. Off. .
3834075 4/1989 Fed. Rep. of Germany .
2601194 1/1988 France .
8702512 4/1987 World Int. Prop. O. .

OTHER PUBLICATIONS

1987 International Symposium Digest Antennas and Propagation, vol. 11, Jun. 1987, pp. 1152–1155; Schmidt: "Low-Cost Microstrip Phased Attay Antenna for Use in Mobile Satellite Telephone Communication Service".

*Primary Examiner*—Reinhard J. Eisenzopf
*Assistant Examiner*—Chi H. Pham
*Attorney, Agent, or Firm*—Sughrue, Mion, Zinn, Macpeak & Seas

[57] ABSTRACT

The microstrip antenna embodying the present invention employs a dielectric material that forms part of a motor vehicle body shell as a dielectric composing element thereof. The motor vehicle-mounted GPS receiver comprising an outer unit, an inner unit, a wireless signal transfer device for transferring signals between the outer unit and the inner unit, and a power source for supplying an electric power to the outer unit, whereby the signal transfer device is provided by a radio receiver installed in the inner unit or by a coupling capacitor consisting of a pair of flat plates and the dielectric motor vehicle body shell sandwiched therebetween. According to the present invention, there is no need of providing the finished motor vehicles with through holes and it is quite simple to equip the finished motor vehicle with the GPS receiver.

9 Claims, 5 Drawing Sheets

MOTOR VEHICLE-MOUNTED RADIO WAVE RECEIVING GPS APPARATUS REQUIRING NO DRILL HOLES FOR MOUNTING

BACKGROUND OF THE INVENTION

1. Field of the invention-mounted

This invention relates to a motor vehicle-mounted radio wave receiving GPS (Global Positioning System) apparatus and, more particularly, to a GPS antenna and GPS receiver to be mounted on a finished motor vehicle for positioning on the Globe by making use of a plurality of artificial satellites.

2. Description of the Prior Art

A navigation system utilizing artificial satellites is currently getting common for motor vehicles in positioning. The positioning may be performed on the ground by receiving radio waves from a plurality of GPS satellites, for example, by receiving the radio waves from three GPS satellites for two-dimensional positioning. Basing on the navigational data contained in a GPS signal received from each GPS satellite, positional information of a self-position or a receiving point such as coordinates can be reckoned in real time.

A typical motor vehicle-mounted GPS signal receiving apparatus has a fundamental structure consisting of an antenna section for receiving radio waves from artificial satellites, a preamplifier section for amplifying received satellite signals, a demodulator section for demodulating the amplified satellite signals so as to attain specific information therefrom, and a computer section for reckoning a present position from the demodulated satellite signals, whereby the preamplifier section, demodulator section and computer section are combined into one unit and installed in a main body of a GPS receiver for being placed normally at a suitable place in the motor vehicle.

On the other hand, a common antenna to be employed in the antenna section for the motor vehicle-mounted GPS receiver is a plane antenna known as a microstrip antenna. FIG. 1 is an upper perspective view showing an antenna element of a conventional microstrip antenna while FIG. 2 is a lower perspective view showing a mounting portion of the same. The microstrip antenna of the prior art shown in FIGS. 1 and 2 comprises a rectangular copper foil 2 which functions as an antenna element is mounted on an upper side of a rectangular dielectric thin plate 1, a copper foil 3 which functions as the ground for the antenna is attached to a lower side overall surface of the same dielectric thin plate 1, and a terminal 4 provided at the lower side of the microstrip antenna for deriving a received satellite signal therefrom.

According to the configuration of the prior art microstrip antenna as described above, it has been necessary for providing a motor vehicle body with a required number of through holes by drilling at the roof for penetrating the terminal 4 therethrough from the upper side to the lower side thereof, and thereby fastening the antenna on the roof with mounting bolts from the inner side of the motor vehicle at respective through holes.

In the prior art motor vehicle-mounted radio wave receiving GPS apparatus, an antenna such as the conventional microstrip antenna for receiving radio waves from the GPS satellites is a separate component of the motor vehicle, so that it has been necessary to mount on the exterior of the motor vehicle. The received satellite signals are required to introduce into the interior of the motor vehicle and that to a GPS receiver with a prescribed antenna cable, therefore, there has been such a problem as that the finished motor vehicle body should be drilled for mounting the antenna with mounting bolts and providing a through hole in order to introduce the antenna cable into the interior thereof upon installation of the radio wave receiving GPS apparatus, thus requiring troublesome extra work on the finished motor vehicle and increasing in the cost of installation. Moreover, the microstrip antenna may fall off from the motor vehicle body due to the loosening of the mounting bolts.

It is therefore an object of this invention to eliminate the problems encountered in the prior art motor vehicle-mounted GPS apparatus and to provide a microstrip antenna for a GPS apparatus which can be installed simultaneously with manufacture of a motor vehicle body and which is securely mounted.

It is another object of this invention to provide a motor vehicle-mounted GPS receiver for a GPS apparatus which can be simply installed in a finished motor vehicle.

SUMMARY OF THE INVENTION

In one aspect of this invention, there is provided a microstrip antenna for a GPS apparatus utilizing a dielectric material that forms part of a motor vehicle body shell as a dielectric composing element of the antenna. Accordingly, the microstrip antenna embodying the present invention can be installed simultaneously with the manufacture of the motor vehicle and firmly fastened to the motor vehicle body with no fear of falling off.

In another aspect of this invention, there is provided a motor vehicle-mounted GPS receiver for a GPS apparatus comprising an outer unit including an antenna for receiving radio waves from artificial satellites and a preamplifier for amplifying a received satellite signal, an inner unit including a demodulator section for demodulating the received satellite signal for deriving a required information therefrom and a computer section for reckoning a self-position from the demodulated signal, a signal transfer device for transferring signals between the outer unit and the inner unit without utilizing any wire, and a power source for supplying an electric power to the outer unit, whereby the signal transfer device is provided by a radio transmitter installed in the outer unit and a radio receiver installed in the inner unit or, by a coupling capacitor consisting of a pair of diametrically opposed flat plates and the dielectric motor vehicle body shell sandwiched therebetween. According to the motor vehicle-mounted GPS receiver embodying the present invention, the signal transferring between the outer unit and the inner unit can be performed by way of wireless or with coupling capacitor and all that the electric power source is placed at the exterior of the motor vehicle, and therefore there is no need of providing the motor vehicles with through holes and it is quite simple to equip the finished motor vehicle with the GPS receiver.

DESCRIPTION OF THE PREFERRED EMBODIMENTS

Figure 1:
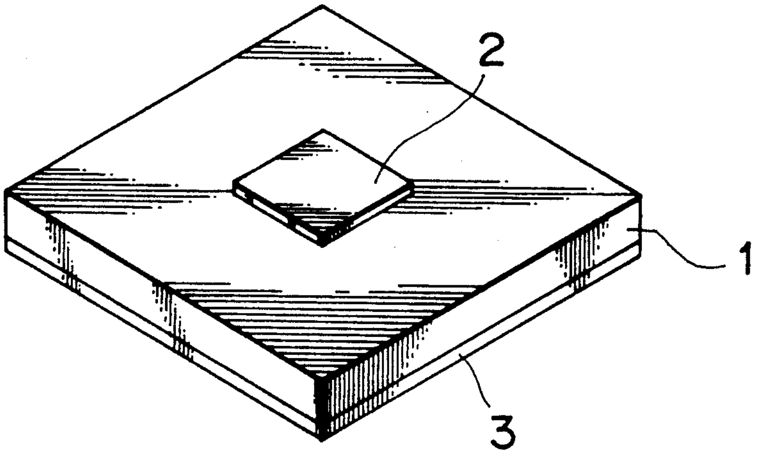
FIG. 1 is a perspective view of a microstrip antenna of the prior art showing the configuration of the upper section.
Figure 2:
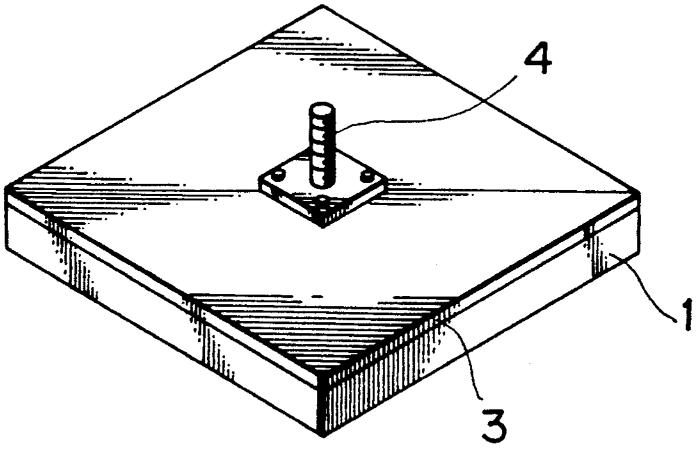
FIG. 2 is a perspective view of the microstrip antenna of the prior art showing the configuration of the lower section.

The features of the present invention which are believed to be novel are set forth with particularly in the appended claims. The invention, together with further objects and advantages thereof, may best be understood by reference to the following description taken in connection with the accompanying drawings, in the several figures of which like reference numerals identify like elements.

Figure 3:
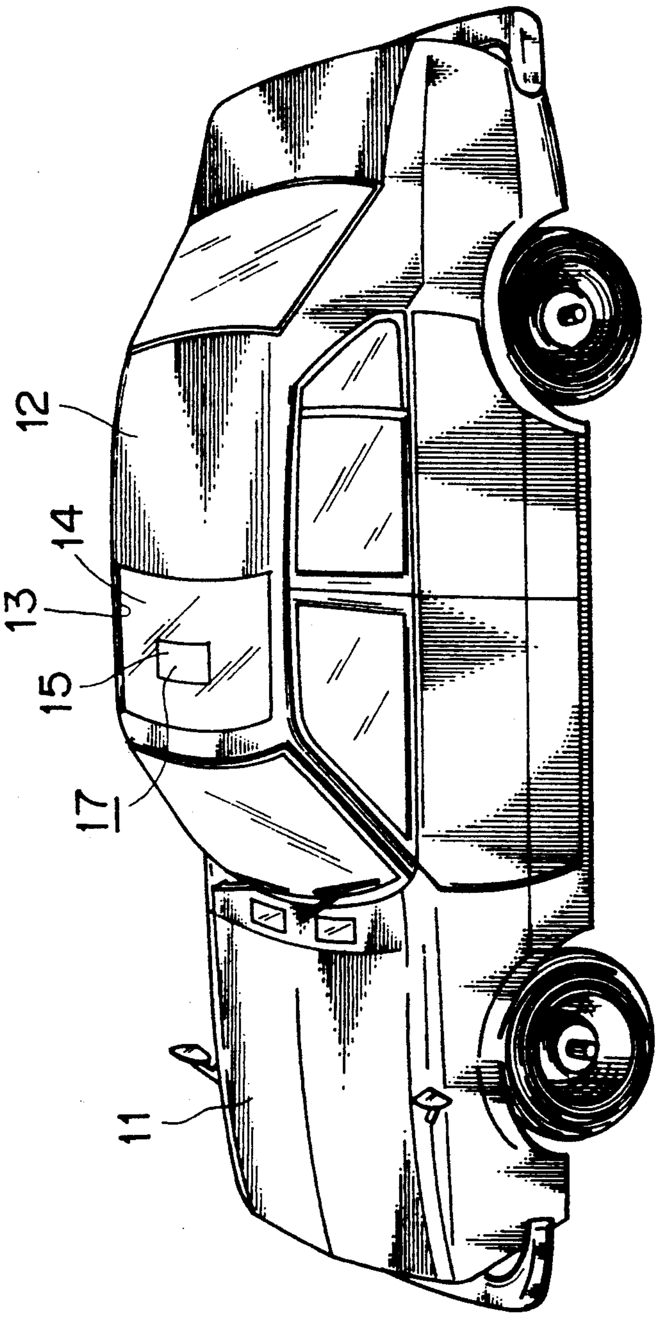
FIG. 3 is a perspective view of the microstrip antenna of the subject invention showing a state of being installed.
Figure 4:
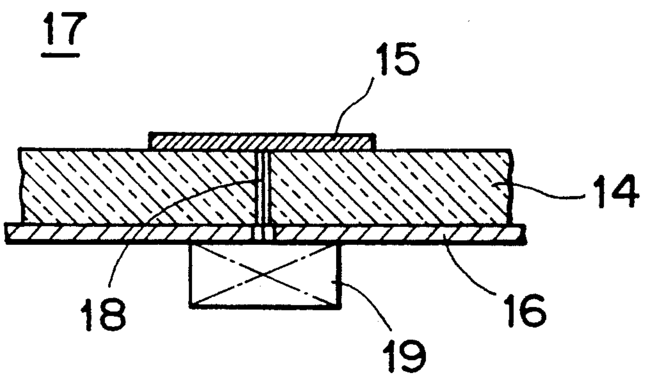
FIG. 4 is a sectional view of the microstrip antenna of the subject invention showing the configuration of the antenna elements.

Referring first to FIG. 3, there is shown a motor vehicle equipped with the microstrip antenna embodying the present invention and a sectional view of which is shown in FIG. 4 for illustrating the configuration of the antenna elements. A motor vehicle body 11 is provided with an opening 13 at the roof 12 thereof and, on which opening 13, a sliding plate 14 such as of glass is mounted in order to form a so-called sunshine roof.

The microstrip antenna 17 shown in FIG. 4 is provided by mounting a first conductive thin film 15, such as of a copper foil which functions as an antenna element, on the glass plate 14 in a rectangular shape and that attaching a second conductive thin film 16, such as of a copper foil or a metal wire mesh which functions as the ground plane, underneath the glass plate 14 within a prescribed region. The conductive thin films 15 and 16 may be attached to glass plate 14 by a suitable adhesive as is known in the art.

Further, the first conductive thin film 15 is conducted through the glass plate 14 by means of a conductive wire 18, which penetrates the glass plate 14 while being insulated from the second conductive thin film 16 thereunder, towards a preamplifier 19 of the GPS receiver mounted on the second conductive thin film 16 (or mounted directly on a lower surface of the glass plate 14).

As it has not been described in detail, however, the roof 12 of the motor vehicle is provided with a recessed portion so that the preamplifier 19 does not hit the roof 12 when the glass plate 14 is slid or the preamplifier 19 is mounted on the glass plate 14 at such a place where is apart from the roof 12 even when the glass plate 14 is moved to the maximum extent.

In accordance with this embodiment of the invention, the microstrip antenna 17 can be installed or assembled simultaneously with the assembling of the sunshine roof without using mounting bolts or the like or, more specifically, can be installed only by providing the glass plate 14 with the first and second conductive thin films 15 and 16 in advance.

Further, since the microstrip antenna 17 is mounted on the roof 12, it is convenient for the microstrip antenna 17 to receive radio waves transmitted from the GPS satellites. Moreover, the sight through the sunshine roof is not interrupted by the second conductive thin film 16 if it is formed into a mesh like form.

It has been described that the metal wire mesh is employed as the second conductive thin film 16 in the embodiment above, however, there will be no need of taking into account of interruption of sight through the sunshine roof if a transparent electrode is utilized instead. On the other hand, if the second conductive thin film 16 is provided at the place where is not concerned with the field of vision, the second conductive thin film 16 may be made of a copper foil.

Further, It has also been described that the glass plate 14 which constitutes the sunshine roof is utilized as the dielectric outer shell of the motor vehicle for use in antenna system, however, a rear window glass, a plastic resin bumper and the like can also be utilized for the same purpose. Still further, if the motor vehicle body were made of a plastic resin in future, any part of the motor vehicle body may be used as the dielectric component of the microstrip antenna.

Figure 5:
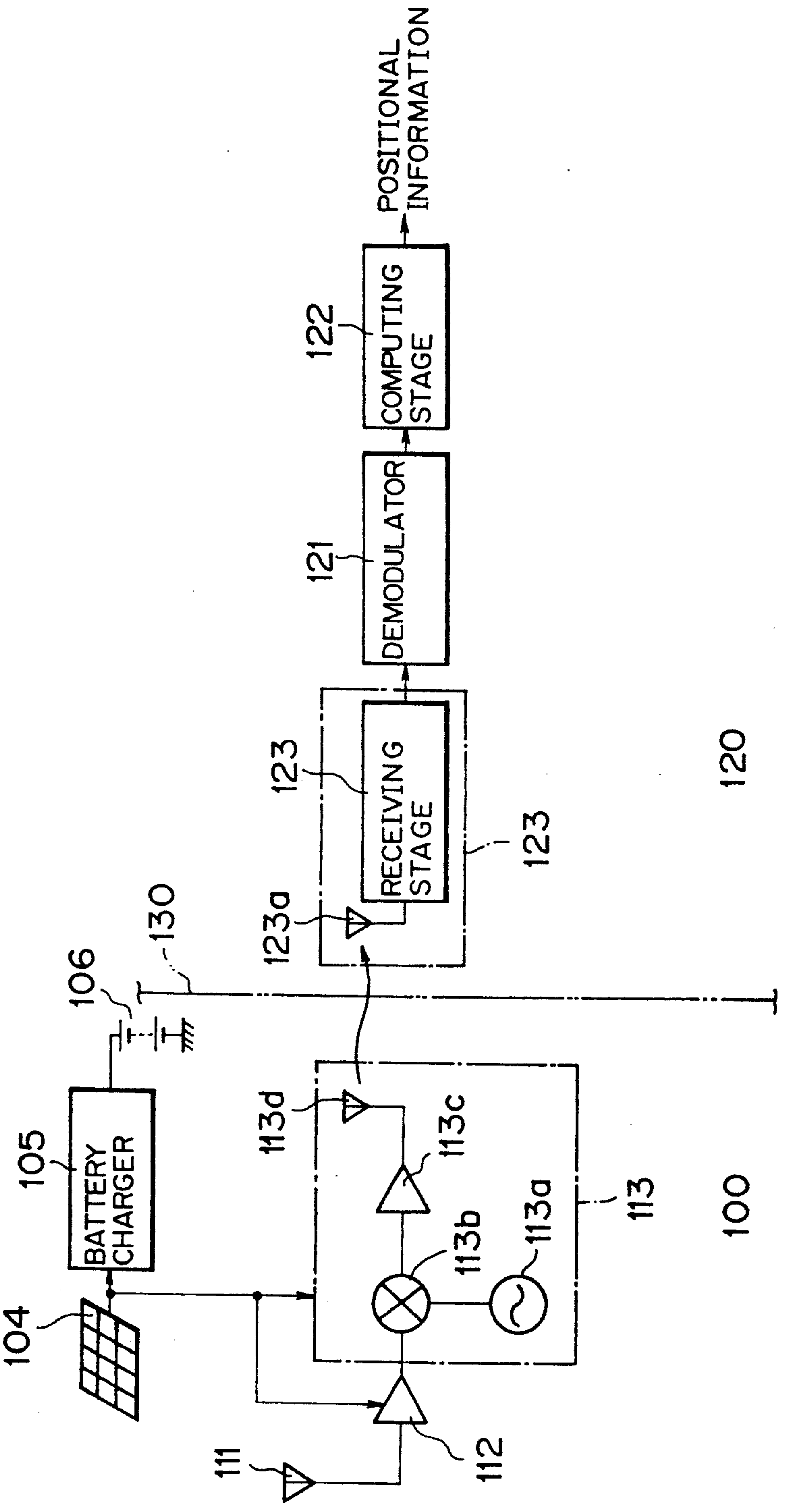
FIG. 5 is a block diagram of the motor vehiclemounted GPS receiver showing an embodiment of this invention.

Now referring to FIG. 5, there is shown a block diagram of a motor vehicle-mounted GPS receiver embodying the present invention. As seen, this motor vehicle-mounted GPS receiver comprises an outer unit 100 which includes an antenna (flat antenna) 111 for receiving radio waves from GPS satellites and a preamplifier 112 for amplifying the received signal, an inner unit 120 which includes a demodulator 121 for demodulating the received signal and a computing stage 122 for reckoning a self-position from the demodulated signal, and a signal transfer means for transferring the received signal between the outer unit 100 and inner unit 120.

The signal transfer means consists of a radio wave transmitter 113 installed in the outer unit 100 and a receiver 123 installed in the inner unit 120, wherein the transmitter 113 includes a local oscillator **113*a* to generate a signal for frequency conversion, a mixer 113*b* to perform the frequency conversion of the received signal fed by the preamplifier 112 upon receiving the signal from the local oscillator 113*a*, a drive amplifier 113*c* for amplifying an output of the mixer 113*b*, and a transmitting antenna 113*d* for transmitting an output of the drive amplifier 113*c*, and the receiver 123 includes a receiving antenna 123*a* for receiving a radio wave transmitted by the transmitting antenna 113*d* through a rear window, door window or the like which allows to pass the radio wave therethrough and constitutes the motor vehicle body shell 130 and a receiving stage 123*b* for supplying a signal received by the receiving antenna 123*a* to a demodulator 121** after amplification.

A solar cell 104 which converts the solar light or other lights into an electric power and charges a secondary battery 106 through a battery charger 105. The outer unit 100 is operated directly by an output of the solar cell 104 while the solar cell 104 generates electric power and, otherwise, by an output of the secondary battery 106 at night or on cloudy day.

In operation, since the outer unit 100 is operated by the solar cell 104 or the secondary battery 106, the radio wave or satellite signal received by the antenna 111 is transmitted through the preamplifier 112 and the transmitter 113. The radio wave transmitted by the transmitter 113 is received by the receiver 123 and fed to the demodulator 121.

According to this embodiment of the invention, the signal transferring between the outer unit 100 and the inner unit 120 is performed by making use of radio wave and all that the outer unit is supplied with power from the solar cell 104 or the secondary battery 106, it is not necessary to provide the finished motor vehicle with through holes at the rear window, door window or the like by machining operation in order to install the GPS apparatus, thus resulting in simple work for the installation.

In addition to this, the use of the solar cell 104 and the secondary battery 106 as the power source of the outer unit 100 eliminates the operation for replacing a battery and in turn this results in easy maintenance.

Further, in accordance with this embodiment, the received signal is transmitted to the inner unit 120 after converting it into a different frequency from that of the satellite signal by providing the outer unit 100 with the local oscillator 113*a* and the mixer 113*b*, it is possible to transfer the information from the outer unit 100 to the inner unit 120 by utilizing the most suitable frequency which has no relation with the frequency for receiving the satellite signals from the GPS satellites.

While this embodiment has been described with reference to the signal transfer means employing the radio wave, however, it is obvious that other type of signal transfer means employing light, ultrasonic wave and the like may be substituted for the radio wave signal transfer means.

Figure 7:
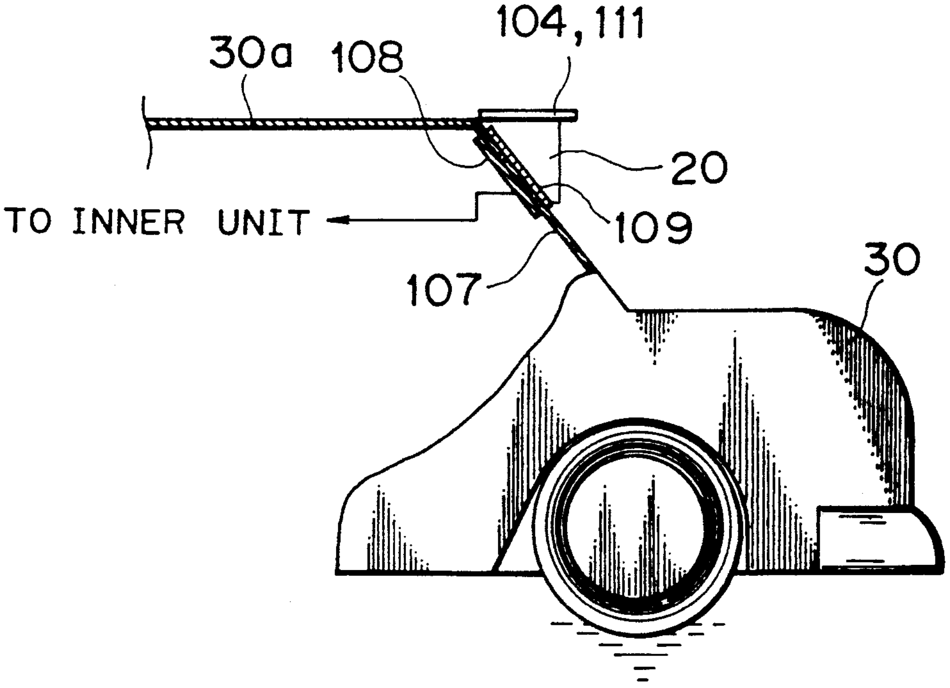
FIG. 7 is an exploded partial sectional view of a section of FIG. 6 showing the configuration of installation.
Figure 6:
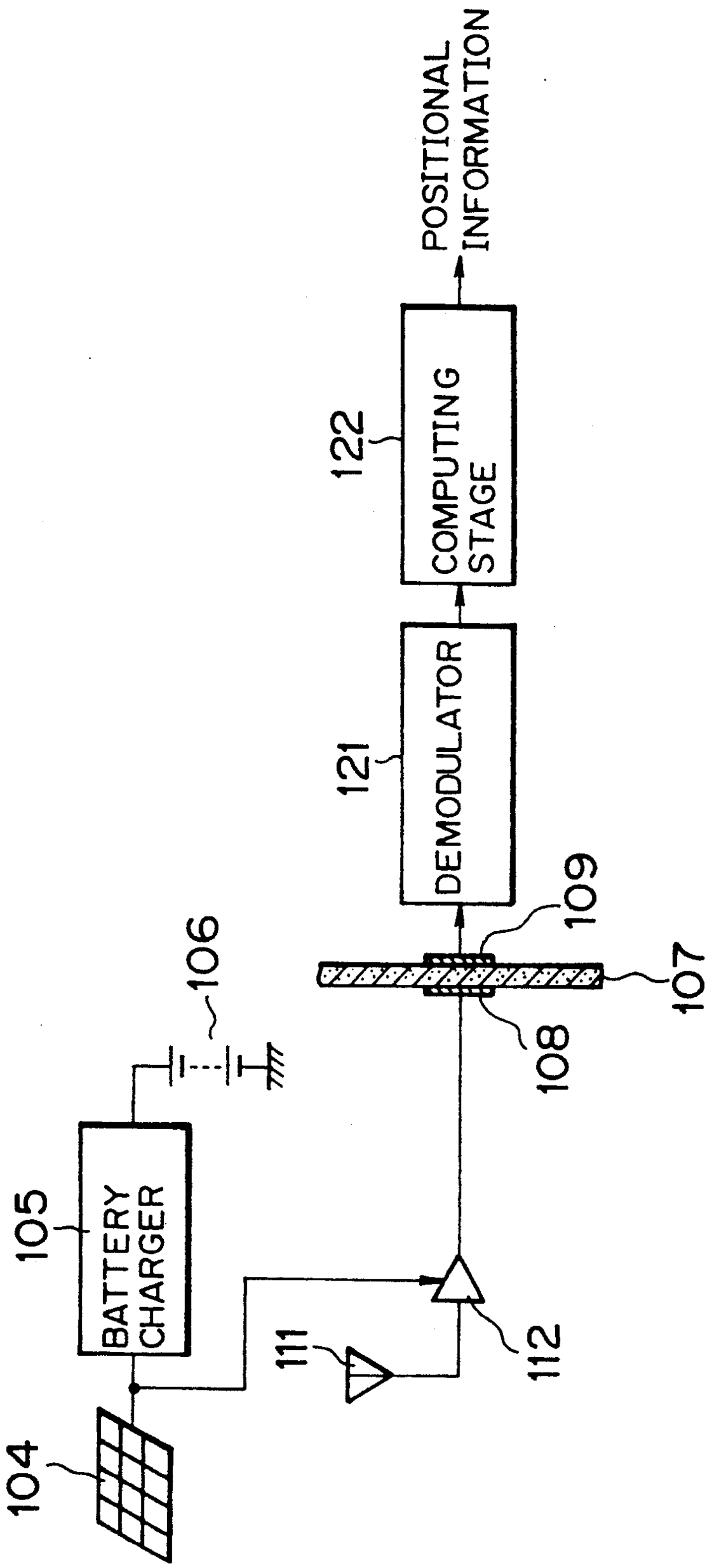
FIG. 6 is a block diagram of the motor vehicle mounted GPS receiver showing another embodiment of this invention.

FIGS. 6 and 7 show another embodiment of the present invention. FIG. 6 is a block diagram showing a structure of the motor vehicle-mounted GPS receiver and FIG. 7 is an exploded partial view of a section of FIG. 6 wherein like numerals identify like elements.

In FIGS. 6 and 7, an element 107 indicates the rear window glass which forms a part of the dielectric outer shell of the motor vehicle 30, and there is provided a pair of diametrically opposed flat electrodes 108 and 109 at the place where the field of vision is not interrupted, whereby the flat electrode 108 is connected to the preamplifier 112 while the flat electrode 109 is connected to the demodulator 121. Accordingly, the pair of diametrically opposed flat electrodes 108 and 109 constitute a capacitor together with the rear window glass 107.

In FIG. 7, a box 20 indicates an outer unit cabinet mounted on the flat electrode 109 and contains the outer unit 100, the battery charger 105 and the secondary battery 106. This outer unit cabinet 20 also functions as a mounting base for the solar cell 104 as well as the antenna 111. Numeral 30*a* designates the top of the motor vehicle 30.

According to this embodiment, an output of the preamplifier 112 contained in the outer unit 100 is transferred to the inner unit 120 by way of the coupling capacitor consisting of the rear window glass 107 and the pair of flat electrodes 108 and 109. Therefore, the same results can be expected as that of the embodiment of FIG. 5.

Although the coupling capacitor of this embodiment has been described as its dielectric component is of the rear window glass 107, however, the coupling capacitor may be provided by utilizing a winds shield glass if the field of view is not interrupted or by utilizing a dielectric motor vehicle outer shell such as the sunshine roof glass.

Further, if the motor vehicle body were made of a plastic resin in future, there will be such advantages for the coupling capacitor as its mounting position may be selected freely.

As it has been described above, since a section of the dielectric outer shell of the motor vehicle can be used as the dielectric component for the microstrip antenna and as well as the coupling capacitor, they can be installed simultaneously with the assembling of the motor vehicle body, thus resulting in the use of no mounting bolts and decreasing the time consumption as well as the cost of the installation.

Further, according to the present invention, no through holes are required for the motor vehicle body in order to install the antenna with mounting bolts or in order to transfer a received signal from the outer unit to the inner unit with signal cable, it is easy and simple to install the GPS apparatus on the finished motor vehicle, moreover, the use of no mounting bolts for the installation of the antenna eliminates the fear of loosing of the mounting bolts for losing the antenna.

In the foregoing specification, the invention has been described with reference to specific exemplary embodiments thereof. It will, however, be evident that various modifications and changes may be made thereunto without departure from the broader spirit and scope of the invention as set forth in the appended claims.

What is claimed is:

1. A GPS receiver for a motor vehiclemounted GPS apparatus comprising:
   - an outer unit mounted at the outside of the motor vehicle body shell including an antenna for receiving radio waves from artificial satellites and a preamplifier for amplifying the received signal;
   - an inner unit located inside the motor vehicle body shell including a demodulator for demodulating the received signal to derive a required information therefrom and a computer for determining a self-position from the demodulated signal;
   - signal transfer means for transferring signals between said outer unit and inner unit by utilizing no wire; and
   - a power source mounted at the outside of the motor vehicle body shell for supplying an electric power to said outer unit, said power source comprising a solar cell and a secondary battery.

2. A GPS receiver for a motor vehicle-mounted GPS apparatus as claimed in claim 1, wherein said signal transfer means comprises a radio wave transmitter contained in said outer unit and a radio wave receiver contained in said inner unit.

3. A GPS receiver for a motor vehicle-mounted GPS apparatus as claimed in claim 1, wherein said signal transfer means comprises a light wave transmitter contained in said outer unit and a light wave receiver contained in said inner unit.

4. A GPS receiver for a motor vehicle-mounted GPS apparatus as claimed in claim 1, wherein said signal transfer means comprises an ultrasonic sound transmitter contained in said outer unit and an ultrasonic sound receiver contained in said inner unit.

5. A GPS receiver for a motor vehicle-mounted GPS apparatus as claimed in claim 1, wherein said signal transfer means comprises a pair of diametrically opposed plane electrodes sandwiching a dielectric material that forms part of motor vehicle body shell.

6. A GPS receiver for a motor vehicle-mounted GPS apparatus comprising:
   - an outer unit mounted at the outside of the motor vehicle body shell including an antenna for receiving radio waves from artificial satellites and a preamplifier for amplifying the received signal;

an inner unit located inside the motor vehicle body shell including a demodulator for demodulating the received signal to derive a required information therefrom and a computer for determining a self-position from the demodulated signal;

signal transfer means for transferring signals between said outer unit and inner unit by utilizing no wire, said signal transfer means comprising a radio wave transmitter contained in said outer unit for transmitting a radio wave, and a radio wave receiver contained in said inner unit for receiving the transmitted radio wave; and a power source mounted at the outside of the motor vehicle body shell for supplying an electric power to said outer unit, wherein said radio wave is different in frequency from that of the received satellite signal.

7. A GPS receiver as claimed in claims 1, 2, 6, 3, 4, or 5, wherein said antenna comprises, a first conductive thin film which functions as an antenna element attached to one side of a thin dielectric plate and a second conductive thin film which functions as a ground plane attached to the other side of the thin dielectric plate, being characterized in that:

said thin dielectric plate consists of a dielectric material that forms part of a motor vehicle body shell.

8. A GPS receiver as claimed in claim 7, wherein said second conductive thin film is a transparent electrode.

9. A GPS receiver as claimed in claim 7, wherein said second conductive thin film is a metal wire mesh electrode.

* * * * *